United States Patent
Oyama et al.

(10) Patent No.: US 11,991,832 B2
(45) Date of Patent: May 21, 2024

(54) UNIT EXCHANGING DEVICE

(71) Applicant: FUJI CORPORATION, Chiryu (JP)

(72) Inventors: Shigeto Oyama, Kariya (JP); Masahiro Kondo, Kasugai (JP); Haruna Narita, Higashiura-cho (JP)

(73) Assignee: FUJI CORPORATION, Chiryu (JP)

( * ) Notice: Subject to any disclaimer, the term of this patent is extended or adjusted under 35 U.S.C. 154(b) by 833 days.

(21) Appl. No.: 17/055,883

(22) PCT Filed: May 28, 2018

(86) PCT No.: PCT/JP2018/020276
§ 371 (c)(1),
(2) Date: Nov. 16, 2020

(87) PCT Pub. No.: WO2019/229786
PCT Pub. Date: Dec. 5, 2019

(65) Prior Publication Data
US 2021/0227731 A1     Jul. 22, 2021

(51) Int. Cl.
*H05K 13/02*     (2006.01)
*H05K 13/08*     (2006.01)

(52) U.S. Cl.
CPC .......... *H05K 13/02* (2013.01); *H05K 13/021* (2013.01); *H05K 13/086* (2018.08)

(58) Field of Classification Search
CPC .... H05K 13/02; H05K 13/021; H05K 13/086; H05K 13/085
See application file for complete search history.

(56) References Cited

U.S. PATENT DOCUMENTS

| | | | | |
|---|---|---|---|---|
| 10,271,436 | B2* | 4/2019 | Inoue | H05K 13/0813 |
| 10,466,683 | B2* | 11/2019 | Ishimoto | H05K 13/085 |
| 11,006,558 | B2* | 5/2021 | Ohashi | H05K 13/085 |
| 11,385,619 | B2* | 7/2022 | Nozawa | G05B 19/4155 |

(Continued)

FOREIGN PATENT DOCUMENTS

| | | | | |
|---|---|---|---|---|
| CN | 106664820 A | * | 5/2017 | ......... H05K 13/0069 |
| EP | 2 874 480 A1 | | 5/2015 | |

(Continued)

OTHER PUBLICATIONS

International Search Report dated Jul. 17, 2018 in PCT/JP2018/020276 filed on May 28, 2018.

*Primary Examiner* — Jeffrey T Carley
(74) *Attorney, Agent, or Firm* — Oblon, McClelland, Maier & Neustadt, L.L.P.

(57) ABSTRACT

A unit exchanging device for automatically exchanging a component supply unit between multiple component mounting devices in which multiple component supply units for supplying components are detachably installed includes: a gripping portion for gripping the component supply unit; a moving section for moving the gripping portion along a predetermined direction between a position for attaching/detaching the component supply unit to and from a component mounting machine; and a control section for controlling the gripping and release of the gripping of the component supply unit by the gripping portion and controlling the moving section so as to change the standby position in accordance with the gripping state of the component supply unit in the gripping portion.

4 Claims, 14 Drawing Sheets

(56) References Cited

U.S. PATENT DOCUMENTS

| | | | | |
|---|---|---|---|---|
| 2004/0073322 | A1* | 4/2004 | Maenishi | H05K 13/085 |
| | | | | 700/28 |
| 2009/0071996 | A1* | 3/2009 | Horie | H05K 13/0419 |
| | | | | 226/29 |
| 2014/0290055 | A1* | 10/2014 | Kurata | H05K 13/08 |
| | | | | 29/832 |
| 2015/0248314 | A1* | 9/2015 | Morita | H05K 13/085 |
| | | | | 718/104 |
| 2017/0135255 | A1* | 5/2017 | Eguchi | H05K 13/08 |
| 2018/0242482 | A1* | 8/2018 | Kunihiro | H05K 13/021 |
| 2018/0310445 | A1* | 10/2018 | Taniguchi | H05K 13/0419 |

FOREIGN PATENT DOCUMENTS

| | | |
|---|---|---|
| EP | 2 874 481 A1 | 5/2015 |
| EP | 3 174 376 A1 | 5/2017 |
| EP | 3 190 864 A1 | 7/2017 |
| JP | 2017-130593 A | 7/2017 |

* cited by examiner

UNIT EXCHANGING DEVICE

TECHNICAL FIELD

This specification discloses a unit exchanging device.

BACKGROUND ART

Conventionally, a unit exchanging device, such as a robot for automatically exchanging feeders, has been proposed (e.g., refer to Patent Literature 1) for use between component mounting machines detachably installed with cassette-type feeders (i.e., component supply units) for supplying components. This unit exchanging device is provided with a clamping mechanism for clamping a feeder and a moving mechanism for moving the clamping mechanism and the like, and performs automatic exchange of a feeder by moving the feeder clamped by the clamping mechanism with the moving mechanism.

PATENT LITERATURE

Patent Literature 1: Japanese Patent Laid-Open No. 2017-130593

BRIEF SUMMARY

Technical Problem

When the number of feeders to be exchanged in a single time period becomes large in the unit exchanging device described above, a certain amount of time becomes necessary to perform automatic exchange since the time to move the clamping mechanism is also increased. Since there is a need to efficiently exchange component supply units in systems comprising such unit exchanging devices and component mounting machines, there is still room for improvement in increasing the productivity of mounting processes.

The present disclosure is primarily intended to improve the exchange efficiency by minimizing the time for moving the clamping mechanism when attaching and detaching a component supply unit.

Solution to Problem

The present disclosure has taken the following means to achieve the main object described above.

The unit exchanging device of the present disclosure is a unit exchanging device for automatically exchanging a component supply unit with multiple component mounting machines in which multiple component supply units for supplying components are detachably installed, comprising: a gripping portion for gripping the component supply unit; a moving section for moving the gripping portion, along a predetermined direction, between a position for attaching/detaching the component supply unit to and from the component mounting machine and a standby position within the unit exchanging device; and a control section, capable of controlling the gripping and release of the gripping of the component supply unit by the gripping portion and the movement of the gripping portion with the moving section, controls the moving section to change the standby position in accordance with the gripping state of the component supply unit in the gripping portion.

In the unit exchanging device of the present disclosure, a control section, capable of controlling the gripping and release of the gripping of the component supply unit by the gripping portion and the movement of the gripping portion by the moving section, controls the moving section to change the standby position in accordance with the gripping state of the component supply unit in the gripping portion. In this way, since it is possible to change the standby position of the gripping portion to a position suitable for automatic exchange, the movement amount of the gripping portion moved by the moving section can be minimized. Therefore, it is possible to improve the exchange efficiency by minimizing the movement time of the gripping portion when attaching/detaching the component supply unit.

DESCRIPTION OF EMBODIMENTS

Figure 1:
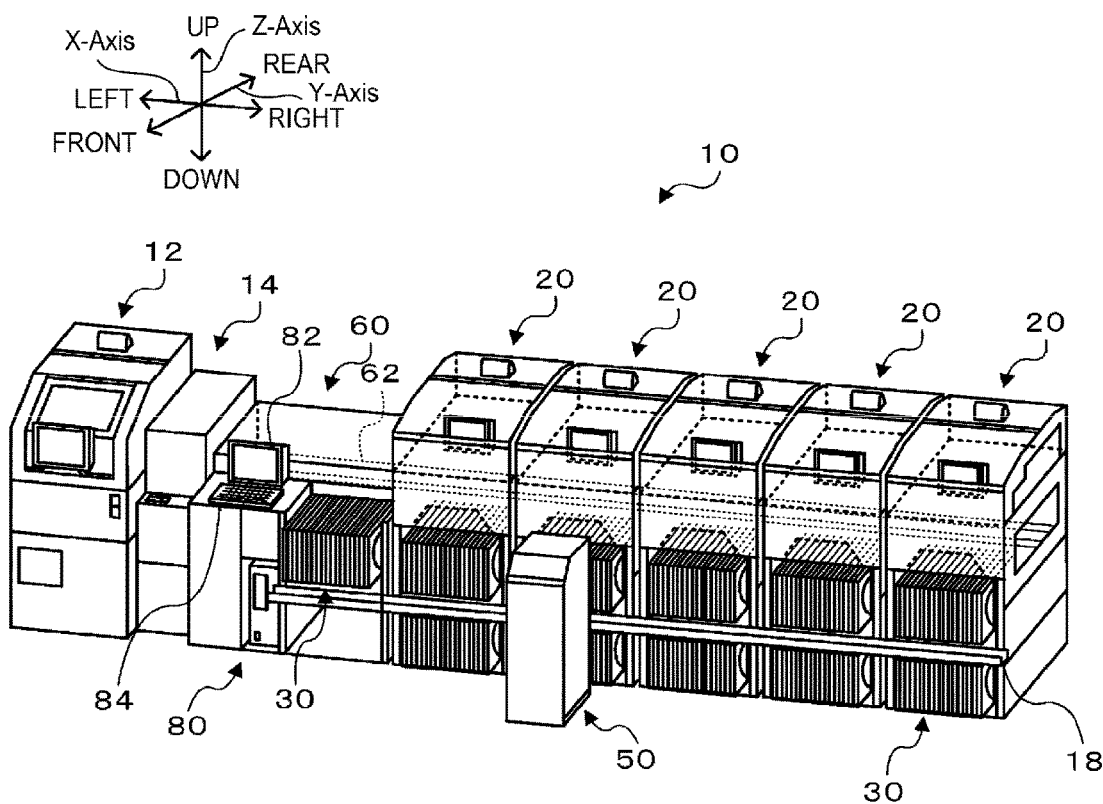
FIG. 1 A diagram showing a schematic configuration of component mounting system 10.
Figure 2:
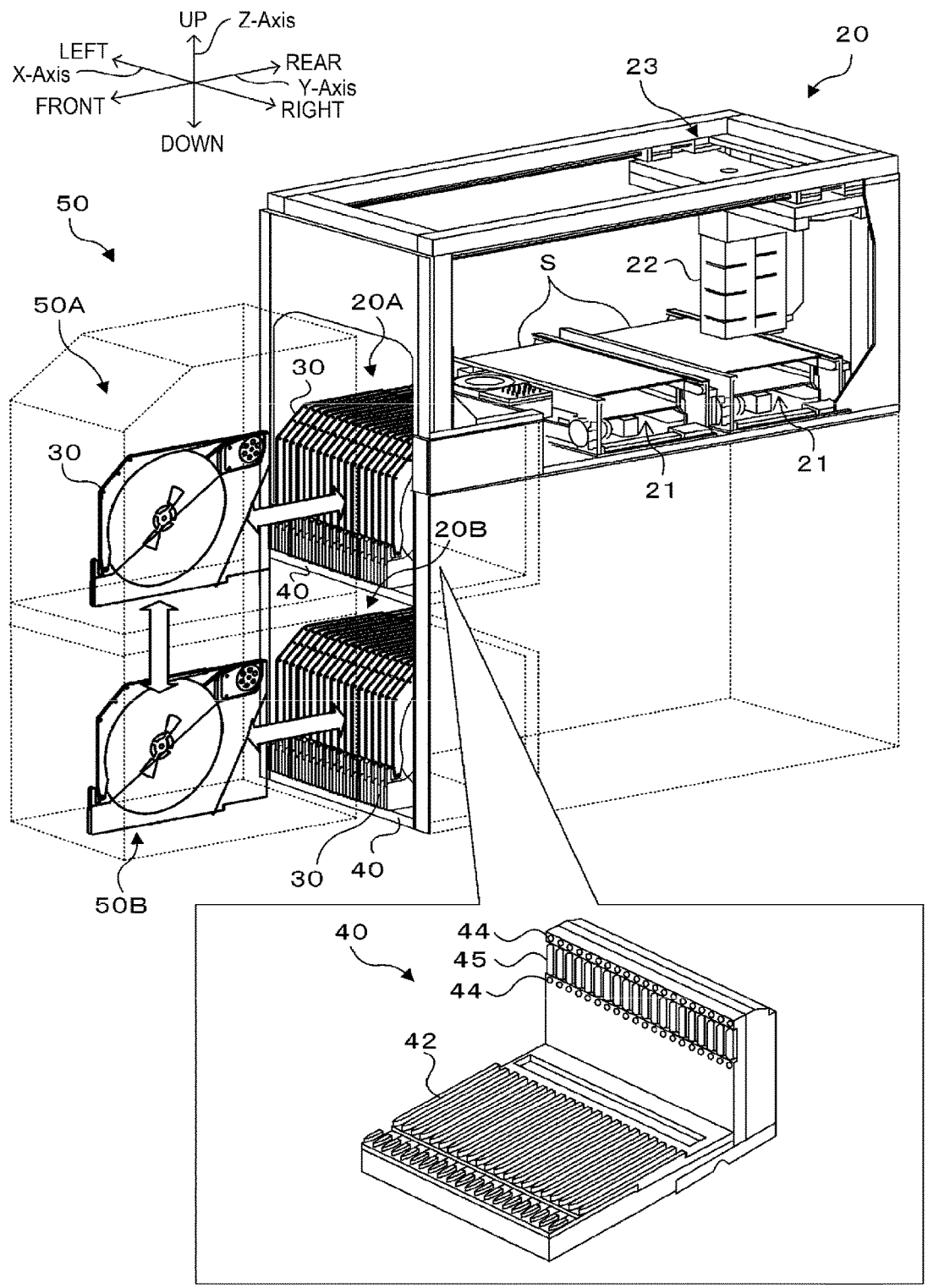
FIG. 2 A diagram showing a schematic configuration of component mounting machine 20.
Figure 3:
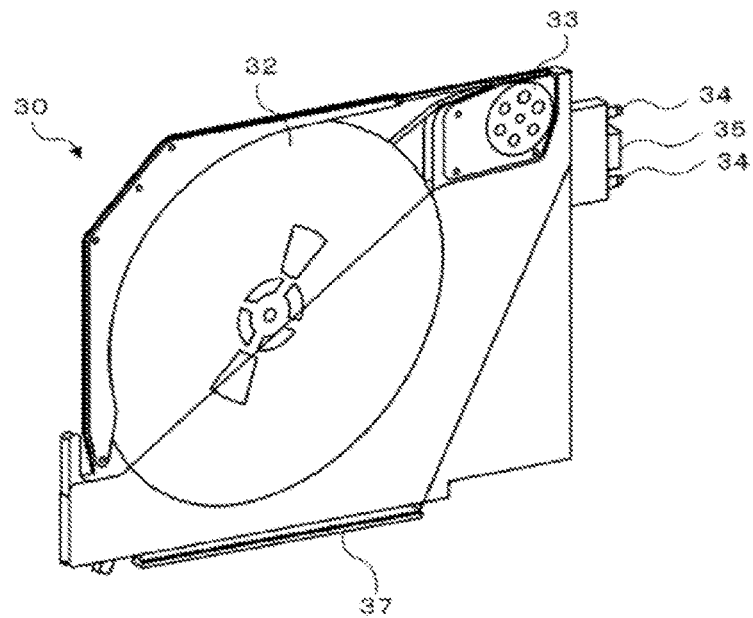
FIG. 3 A diagram showing a schematic configuration of feeder 30.
Figure 4:
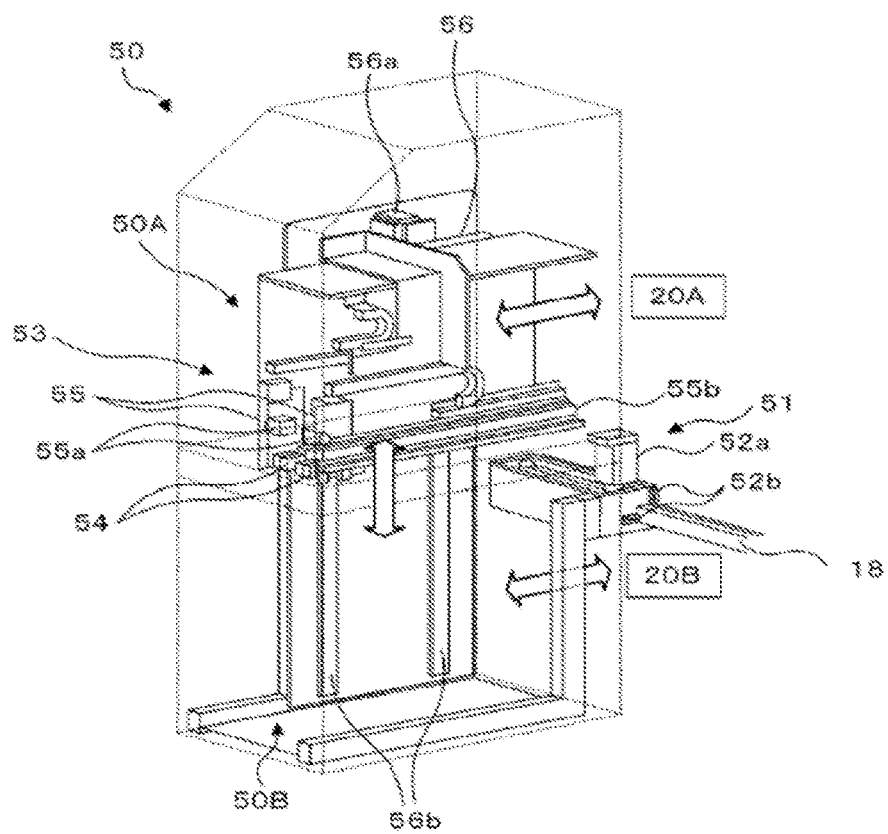
FIG. 4 A diagram showing a schematic configuration of loader 50.
Figure 5A:
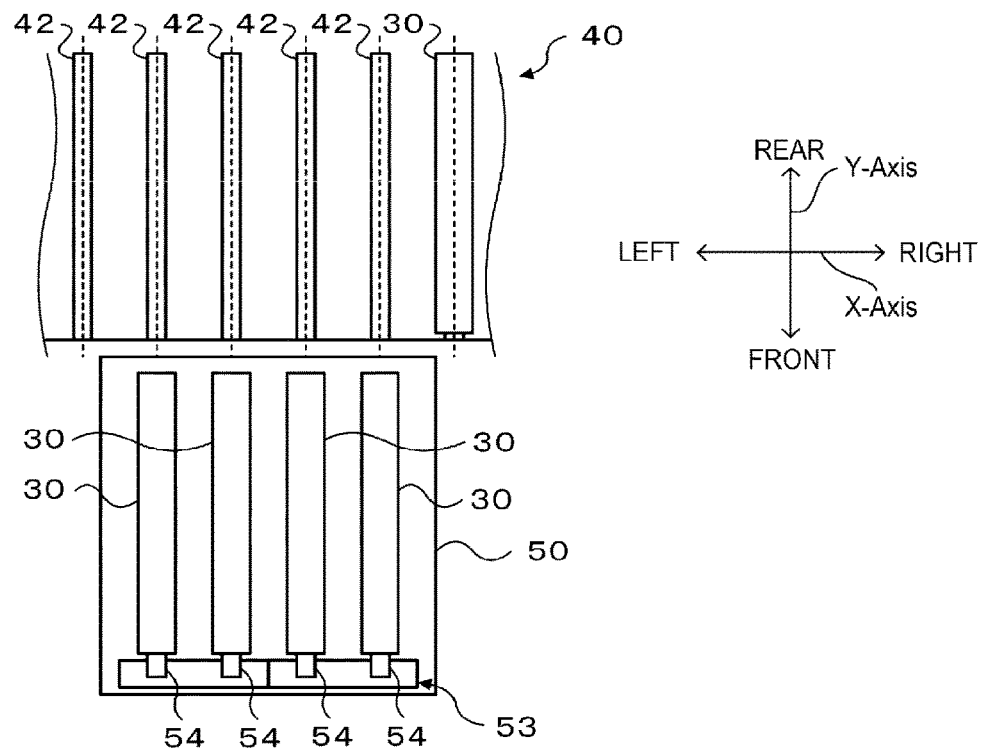
FIG. 5 A diagram showing an automatic exchange of feeder 30 by loader 50.
Figure 5B:
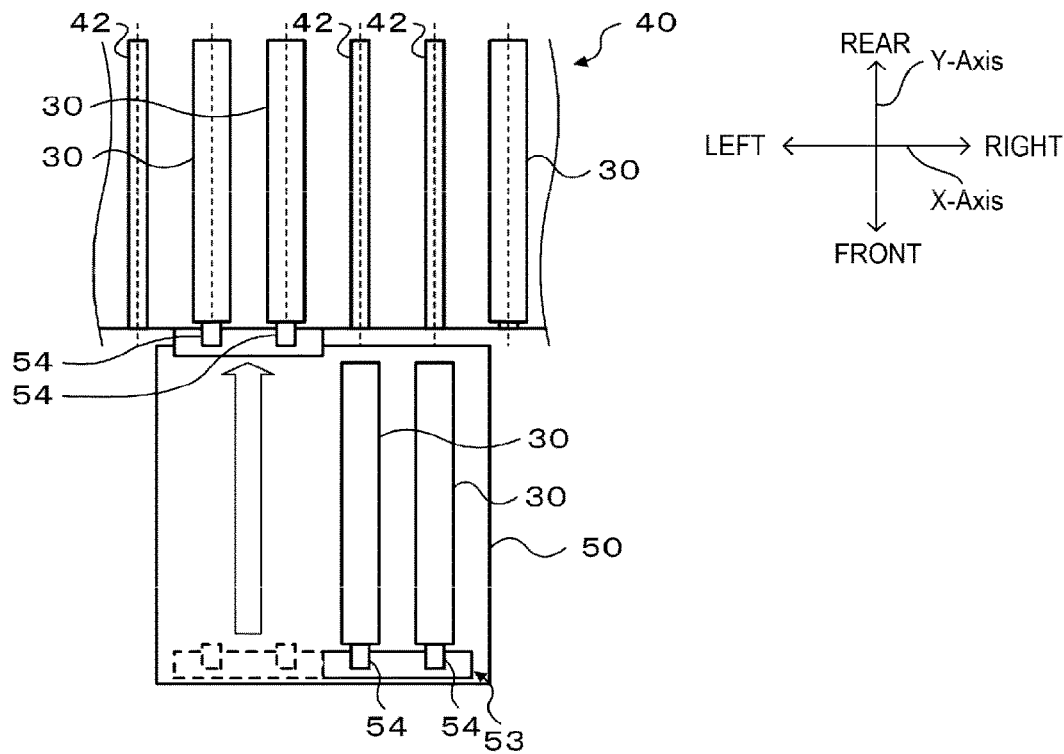
Figure 6:
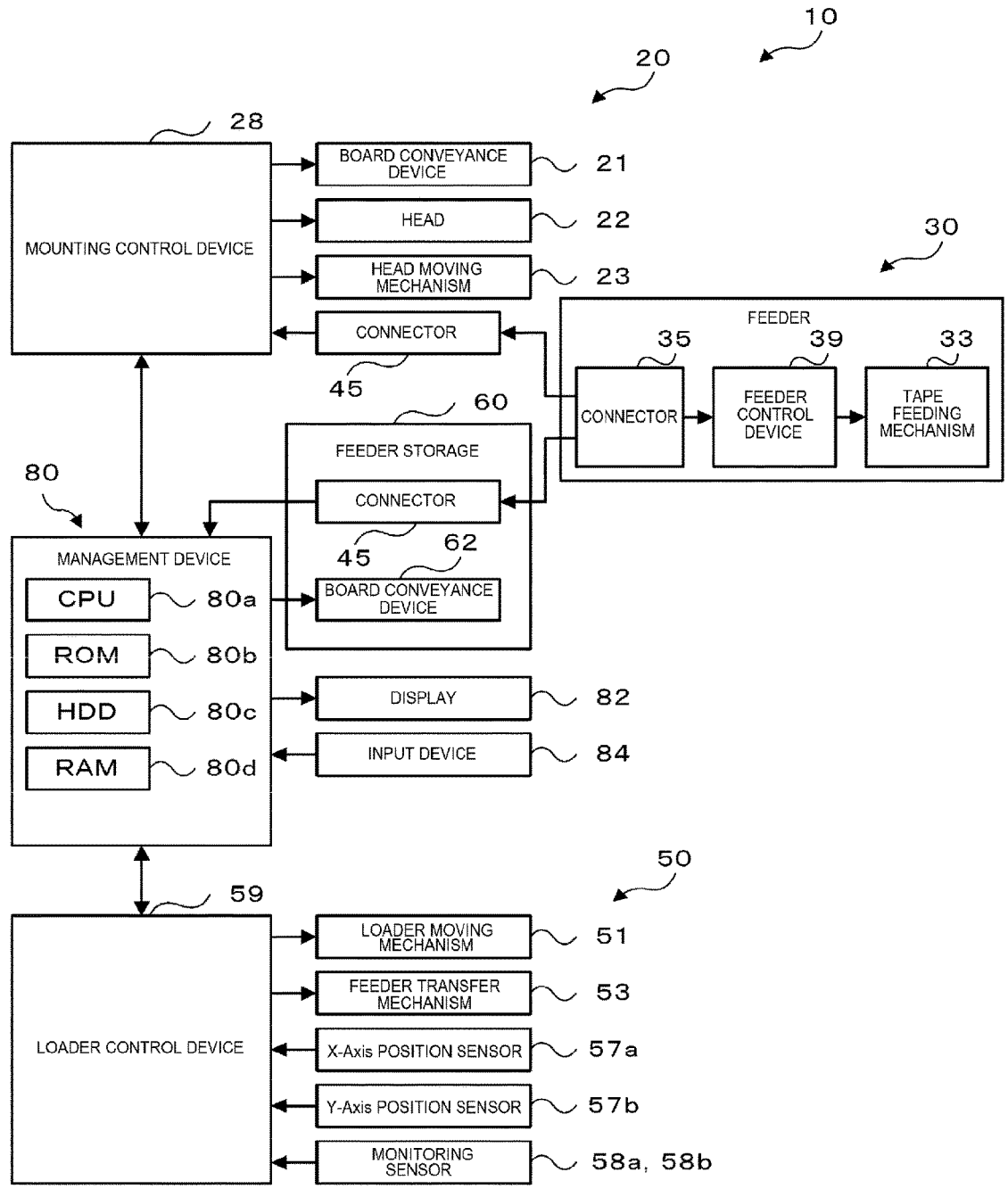
FIG. 6 A configurational diagram related to the controlling of component mounting system 10.

Next, embodiments of the present disclosure will be described with reference to the drawings. FIG. 1 is a diagram showing a schematic configuration of component mounting system 10 of the present embodiment, FIG. 2 is a diagram showing a schematic configuration of component mounting machine 20, and FIG. 3 is a diagram showing a schematic configuration of feeder 30. Further, FIG. 4 is a diagram showing a schematic configuration of loader 50, FIG. 5 is a diagram showing an automatic exchange of feeder 30 by loader 50, and FIG. 6 is a configurational diagram related to the controlling of component mounting system 10. The left-right direction of FIG. 1 is the X-direction, the front-rear direction is the Y-direction, and the up-down direction is the Z-direction.

Component mounting system 10, as shown in FIG. 1, has printing machine 12, printing inspection machine 14, multiple component mounting machines 20, a mounting inspection machine (not shown), loader 50, feeder storage 60, and management device 80 (refer to FIG. 6). Printing machine 12 prints solder on board S. Printing inspection machine 14 inspects the state of solder printed by printing machine 12. Multiple component mounting machines 20 are installed side by side along the conveyance direction of board S (i.e., the X-direction) and mount components supplied from feeder 30 onto board S. The mounting inspection machine inspects the mounted state of components mounted with component mounting machine 20. Loader 50 replenishes required feeders 30 to multiple component mounting machines 20 and recovers used feeders 30 from multiple component mounting machines 20. Feeder storage 60 stores feeders 30 scheduled for use in component mounting machines 20 and used feeders 30. Management device 80 manages the entire system. Printing machine 12, printing inspection machine 14, multiple component mounting machine 20, and the mounting inspection machine are installed side by side in the conveyance direction of board S in this order and constitute a production line. Feeder storage 60 is incorporated in the production line of component mounting system 10 and is installed between the most upstream component mounting machine 20, along the conveyance direction of board S, among the multiple component mounting machines 20 and printing inspection machine 14. In this embodiment, an operator replenishes feeders 30 to feeder storage 60 or recovers feeders 30 from feeder storage 60. In addition to the devices already mentioned, component mounting system 10 may be provided with a reflow device or the like for performing a reflow process of board S mounted with components.

Component mounting machine 20, as shown in FIG. 2, has board conveyance device 21 for conveying board S in the X-direction, head 22 having a suction nozzle for picking up components supplied by feeder 30, head moving mechanism 23 for moving head 22 in the XY-direction, and mounting control device 28 for controlling the entire device (refer to FIG. 6). Mounting control device 28 is composed of a well-known CPU, ROM, RAM, and the like, and outputs drive signals to board conveyance device 21, head 22, head moving mechanism 23, and the like.

Feeder 30, as shown in FIG. 3, is configured as a tape feeder for feeding tape for accommodating components at a predetermined pitch. Feeder 30 includes tape reel 32 on which the tape is wound, tape feeding mechanism 33 for feeding tape from tape reel 32, connector 35 having two positioning pins 34, rail member 37 provided on the bottom edge, and feeder control device 39 (refer to FIG. 6). Feeder control device 39 includes a well-known CPU, ROM, RAM, and the like, and outputs a drive signal to tape feeding mechanism 33. Further, feeder control device 39 can communicate with the control section of the attachment destination (mounting control device 28, management device 80, etc.) for feeder 30 via connector 35.

Component mounting machine 20, as shown in FIG. 2, has two areas at the front (i.e., an upper area and a lower area) capable of installing feeders 30. The upper area is supply area 20A in which feeders 30 can supply components and the lower area is stock area 20B in which feeders 30 are stocked. Supply area 20A and stock area 20B are provided with feeder base 40 which has an L-shape in a side view and to which multiple feeders 30 are individually installed. Feeder base 40 is provided with multiple slots 42 arranged in the X-direction with a space into which rail member 37 of feeder 30 can be inserted, two positioning holes 44 into which two positioning pins 34 can be inserted, and connector 45 provided between the two positioning holes 44 and to which connector 35 connects. Component mounting machine 20 is not limited to a configuration provided with feeder stock area 20B and may have a configuration that does not include feeder stock area 20B.

Loader 50, as shown in FIG. 1, is movable along X-axis rail 18 provided, in parallel with the board conveyance direction (i.e., the X-direction), on the front face of multiple component mounting machines 20 and the front face of feeder storage 60. Note that representation of X-axis rail 18 is omitted in FIG. 2. Loader 50, as shown in FIGS. 4 to 6, is provided with loader moving mechanism 51, feeder transfer mechanism 53, X-axis position sensor 57a, Y-axis position sensor 57b, left and right monitoring sensors 58a, 58b, and loader control device 59. Loader moving mechanism 51 moves loader 50 along X-axis rail 18 and is provided with X-axis motor 52a, such as a servo motor, for driving a drive belt, and guide roller 52b for guiding the movement of loader 50 along X-axis rail 18. Feeder transfer mechanism 53 transfers feeder 30 to component mounting machine 20 and feeder storage 60. Feeder transfer mechanism 53 includes clamp portions 54, for clamping feeder 30, and Y-axis slider 55 on which two (i.e., two pairs of) clamp portions 54 are disposed, Y-axis slider 55 being configured to move the two clamp portions 54 integrally along Y-axis guide rail 55b in the front-rear direction (i.e., the Y-direction) by the driving of Y-axis motor 55a. With two clamp portions 54 being disposed on each of two Y-axis sliders 55, feeder transfer mechanism 53 moves a total of four (i.e., four pairs of) clamp portions 54, as two independent pairs, in the Y-direction. Further, two Y-axis position sensors 57b are provided, each of which detect the position in the Y-direction of the two clamp portions 54 of Y-axis slider 55. Feeder transfer mechanism 53, for example, may be configured to slide Y-axis slider 55 by converting the rotational power of Y-axis motor 55a in the front-rear direction by a conversion mechanism such as a belt mechanism or a rack-and-pinion mechanism, or may be configured to use a conversion mechanism such as a ball-screw mechanism. FIG. 5A shows the clamping of a total of four feeders 30, with a feeder in each clamp portion 54. Further, FIG. 5B shows feeders 30 installed in each of two slots 42 of component mounting machine 20 after moving two clamp portions 54 of the left side toward component mounting machine 20 (i.e., rearward). Further, feeder transfer mechanism 53 includes Z-axis motor 56a for moving slide base 56 in the up-down direction (Z-direction) along Z-axis guide rail 56b, slide base 56 being a base on which clamp portions 54 and Y-axis slider 55 are installed in a slidable manner.

X-axis position sensor 57a detects the moving position of loader 50 in the X-direction. Monitoring sensors 58a,58b monitor the presence/absence of an obstacle (including an operator) and is configured with, for example, an infrared sensor. Monitoring sensor 58a is installed on the left side of loader 50 (i.e., the side opposite to the conveyance direction of board S) and mainly detects an obstacle in the monitoring area to the left of loader 50. Monitoring sensor 58b is installed on the right side of loader 50 (i.e., the same side as the conveyance direction of board S) and mainly detects an obstacle in the monitoring area to the right of loader 50. Loader control device 59 includes a well-known CPU, ROM, RAM, and the like. Loader control device 59 receives detection signals from X-axis position sensor 57a, Y-axis position sensor 57b, and monitoring sensors 58a,58b, and outputs drive signals to loader moving mechanism 51 (X-axis motor 52a) and feeder transfer mechanism 53 (clamp portions 54, Y-axis motor 55a, Z-axis motor 56a).

When performing automatic exchange of feeder 30, load control device 59 first controls X-axis motor 52a to move loader 50 to a position that causes Y-axis slider 55 of loader 50 to face slot 42 of the component mounting machine 20 in which an automatic exchange is to be performed. Further, when performing automatic exchange to and from supply area 20A of component mounting machine 20, loader control device 59 controls Z-axis motor 56a to move slide base 56 (Y-axis slider 55) to upper transfer area 50A facing supply area 20A. On the other hand, when performing automatic exchange to and from stock area 20B of component mounting machine 20, loader control device 59 controls Z-axis motor 56a to move slide base 56 to lower transfer area 50B facing stock area 20B. When installing feeder 30 in loader 50 onto component mounting machine 20, loader control device 59 controls Y-axis motor 55a to move Y-axis slider 55 to the component mounting machine 20 side (i.e., rearward) while feeder 30 is clamped in clamp portion 54 (refer to FIG. 5A). As a result, rail member 37 of feeder 30 is inserted into slot 42 of feeder base 40 (see FIG. 5B). Subsequently, loader control device 59 installs feeder 30 to feeder base 40 of component mounting machine 20 by releasing the clamping of feeder 30 by clamp portion 54. Further, when removing feeder 30 from component mounting machine 20 and collecting feeder 30 into loader 50, loader control device 59 controls Y-axis motor 55a to move Y-axis slider 55 to the component mounting machine 20 side (i.e., rearward). Subsequently, after clamping feeder 30 installed in feeder base 40 with clamp portion 54, loader control device 59 controls Y-axis motor 55a to move Y-axis slider 55 forward. As a result, feeder 30 is removed from feeder base 40 and recovered in loader 50.

Feeder base 40 of the same configuration as feeder base 40 provided in component mounting machine 20 is provided in feeder storage 60 in order to accommodate multiple feeders 30. Further, feeder base 40 of feeder storage 60 is provided at the same height as feeder base 40 of supply area 20A of component mounting machine 20 (i.e., the same Z-direction position). Therefore, loader 50 attaches/detaches feeder 30 with respect to feeder base 40 of feeder storage 60 in the same operation as when attaching/detaching feeder 30 with respect to feeder base 40 of component mounting machine 20.

Further, board conveyance device 62 for conveying board S in the X-direction is provided behind feeder storage 60. Board conveyance device 62 is in the same position in the front-rear direction and the up-down direction as board conveyance device (not shown) of printing inspection machine 14 and board conveyance device 21 of the adjacent component mounting machine 20. Therefore, board conveyance device 62 can convey board S received from board conveyance device of printing inspection machine 14 to board conveyance device 21 of the adjacent component mounting machine 20.

Figure 7:
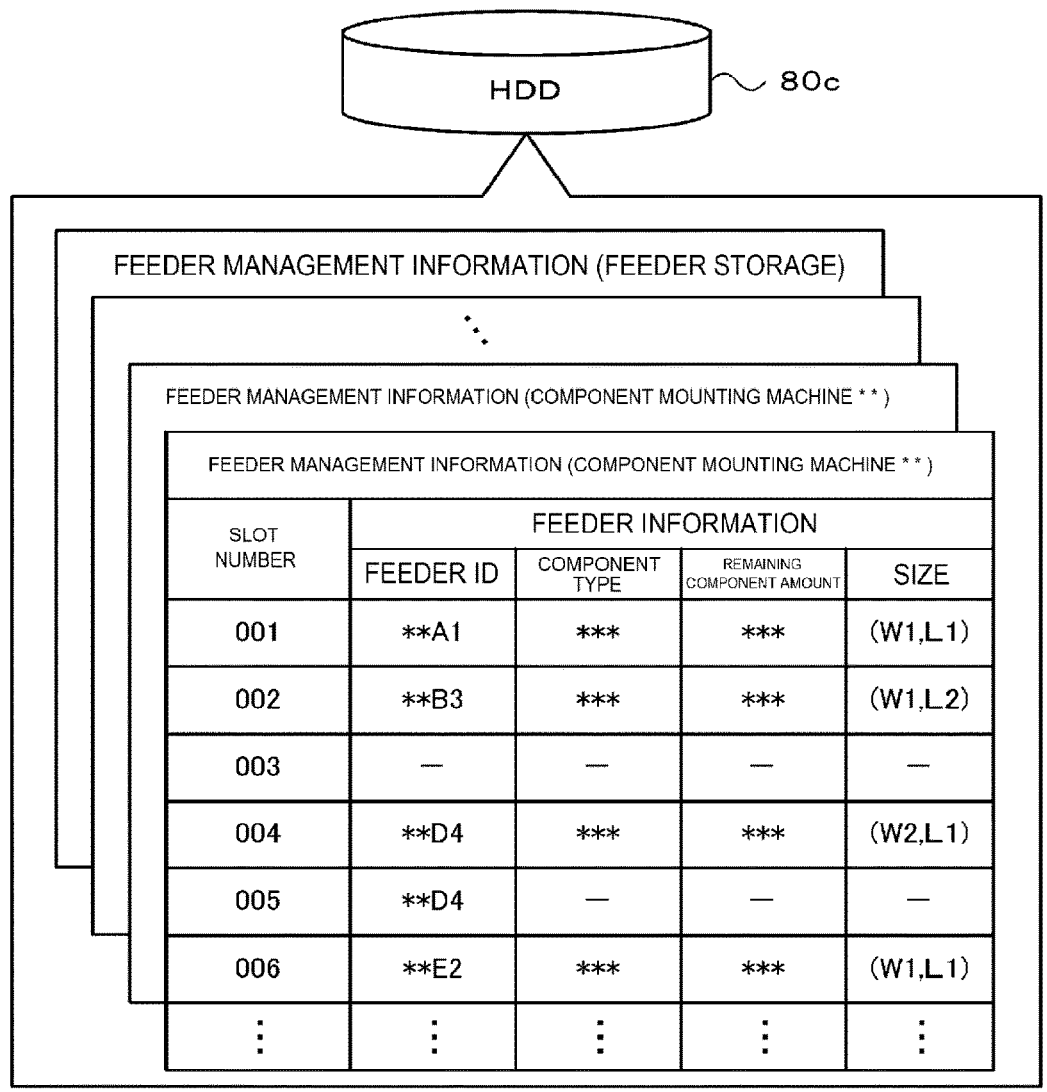
FIG. 7 A diagram showing an example of feeder management information.

As shown in FIG. 6, management device 80 is composed of a well-known CPU 80a, ROM 80b, HDD 80c, RAM 80d, and the like, and is provided with display 82, such as an LCD, and input device 84, such as a keyboard or a mouse. Management device 80 stores a production program of board S, feeder management information, and the like. Production program of board S refers to a program that defines which components to mount on which board S, how many boards S mounted in this manner are to be produced, and the like. Feeder management information is information relating to feeders 30 retained by each component mounting machine 20 and feeder storage 60. FIG. 7 is a diagram showing an example of feeder management information. As shown in the figure, feeder management information includes slot numbers (positional information) of feeder base 40 to which each feeder 30 is installed, feeder ID (identification information) of feeder 30 installed in each slot 42, the kind of components held by each feeder 30, the remaining amount of components, the size indicating the width W in the X-direction and the length L in the Y-direction of feeder 30, and the like. Incidentally, among feeders 30, there are feeders 30 which occupy not only one slot 42 into which rail member 37 is inserted but contiguous multiple slots 42 because the width W is large. As an example, FIG. 7 shows a case where feeder 30 of slot number 004 having width W2 occupies slot numbers 004, 005, a shared feeder ID is registered to slot numbers 004, 005, and other information is registered to slot number 004. Of course, the same information as that of slot number 004 may also be registered to slot number 005.

Management device 80 is connected to mounting control device 28 in a communicable manner by wire and connected to loader control device 59 wirelessly in a communicable manner, and is also connected in a communicable manner to each control device of printing machine 12, printing inspection machine 14, and the mounting inspection machine. Management device 80 receives information on the mounting state of component mounting machine 20 and information on the attached/detached feeder 30 from mounting control device 28, and receives information on the drive status of loader 50 from loader control device 59. When management device 80 receives information from mounting control device 28 about feeder 30 removed from feeder base 40 of component mounting machine 20 and feeder 30 removed from feeder base 40, management device 80 updates the feeder management information of component mounting machine 20. Further, management device 80 outputs a drive signal to board conveyance device 62 of feeder storage 60 and causes board conveyance device 62 to convey board S. Further, management device 80 is communicably connected to feeder control device 39, of feeder 30 attached to feeder base 40 of feeder storage 60, via connectors 35, 45 and can therefore acquire information of feeder 30. When obtaining information about feeder 30 attached to feeder base 40 of feeder storage 60 and feeder 30 removed from feeder base 40, management device 80 updates the feeder management information of feeder storage 60.

Figure 8:
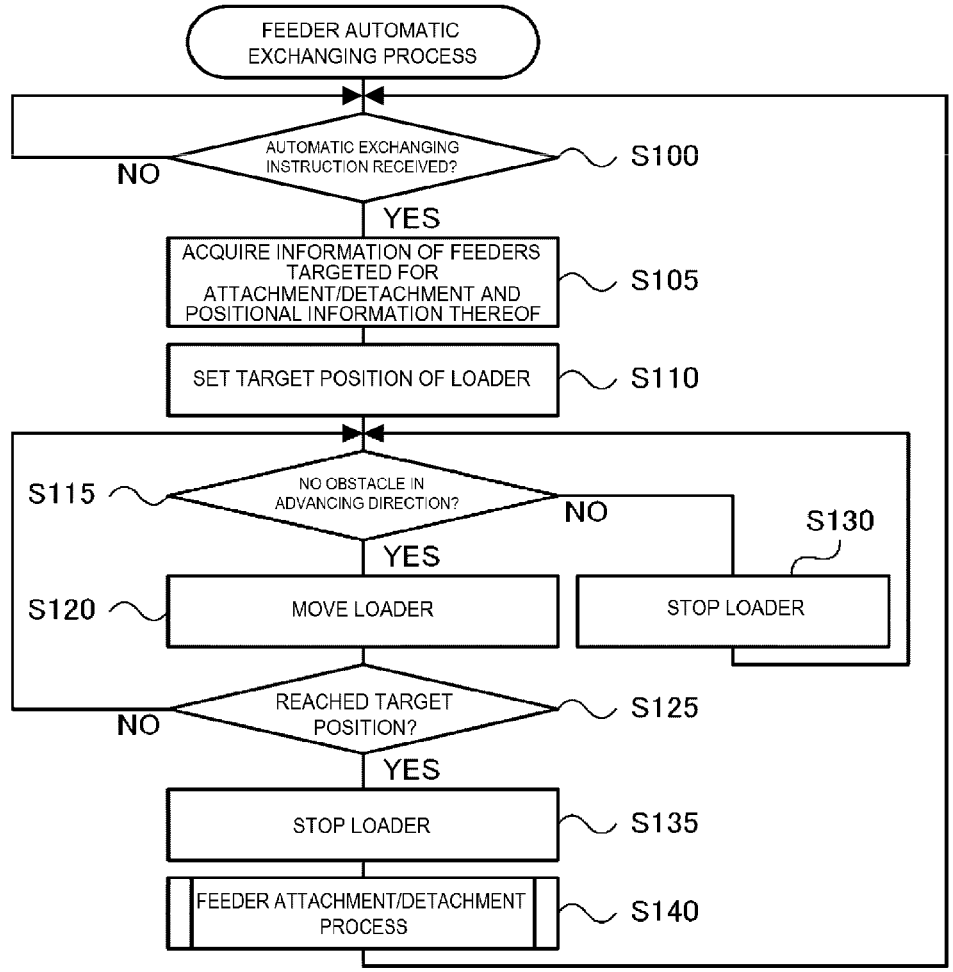
FIG. 8 A flowchart showing an example of a feeder automatic exchange process.

The operation of component mounting system 10 configured in this manner, particularly the operation when loader 50 automatically exchanges feeder 30, will be described. FIG. 8 is a flowchart showing an example of a feeder automatic exchange process. This process is executed by loader control device 59 of loader 50. In the feeder automatic exchange process, loader control device 59 waits to receive automatic exchange instructions for feeder 30 outputted from management device 80 (S100). The automatic exchange instructions includes instructions for attaching/detaching feeder 30 and its attaching/detaching position. Management device 80 transmits instructions for removing feeder 30 accommodating a component required in the next mounting process from feeder storage 60 and instructions for installing the removed feeder 30 to supply area 20A of each component mounting machine 20. Further, management device 80 transmits instructions for removing feeder 30 accommodating components not required in the next mounting process and feeder 30 whose remaining component amount value has become 0 from supply area 20A and instructions for installing the removed feeder 30 to stock area 20B and feeder storage 60. Incidentally, the automatic exchange instruction targeting the wide feeder 30 occupying multiple slots 42 includes the adjacent slot number to be occupied by feeder 30 in addition to the slot number which is an attach/detach position for attaching/detaching feeder 30.

When loader control device 59 receives automatic exchange instructions in S100, loader control device 59 acquires, from the received automatic exchange instructions, feeder information of targets for attachment/detachment and positional information for attaching/detaching feeder 30 (S105). Positional information of S105 includes information regarding whether attaching/detaching of feeder 30 will be performed on feeder base 40 of any one of supply area 20A and stock area 20B of storage area 60 and component mounting machine 20 and information of slot numbers of attaching/detaching destinations of feeders 30 in each feeder base 40. Next, loader control device 59 sets the target position of loader 50 based on the positional information of S105 (S110). The target position is a position among attachment/detachment positions in loader 50 to which feeder 30 can be attached/detached.

Subsequently, loader control device 59 determines whether an obstacle (operator) is detected in the advancing direction with monitoring sensor 58a or monitoring sensor 58b based on the target position and the current position of loader 50 (S115). When it is determined that an obstacle is not detected in the advancing direction, loader control device 59 controls X-axis motor 52a to move loader 50 toward the target position (S120) and determines whether loader 50 has reached the target position (S125) based on the detected position by X-axis position sensor 57a. On the other hand, when it is determined that an obstacle is detected, loader control device 59 stops loader 50 (S130) and returns to S115. Thus, when an obstacle (operator) is detected in the advancing direction of loader 50, loader control device 59 stops loader 50 and restarts the movement of loader 50 when an obstacle is not detected. Then, when it is determined that loader 50 has reached the target position in S125, loader control device 59 stops loader 50 (S135), executes the feeder attachment/detachment process (S140), and returns to S100.

Figure 9:
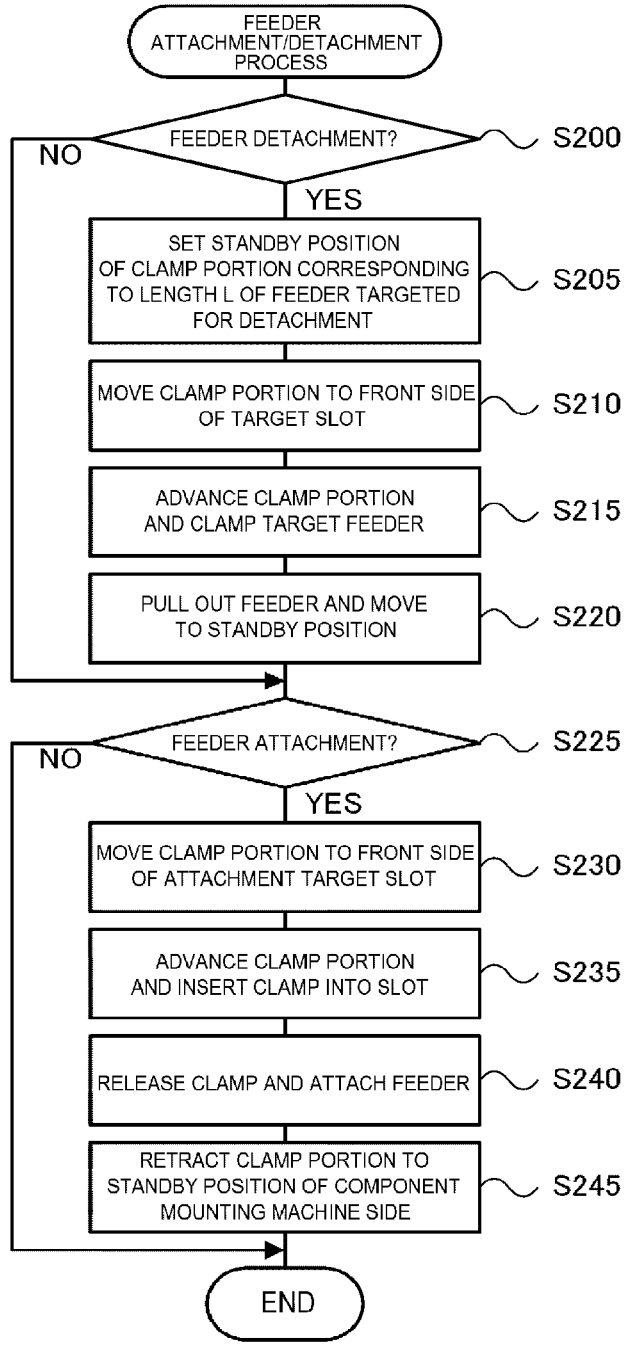
FIG. 9 A flowchart showing an example of a feeder attachment/detachment process.

FIG. 9 is a flowchart showing an example of the feeder attachment/detachment process. In this feeder attachment/detachment process, loader control device 59 first determines whether a removal of feeder 30 is included in the present automatic exchange instructions (S200) and when it is determined that a removal is not included, the process proceeds to S225. When it is determined that a removal of feeder 30 is included, loader control device 59 sets a standby position corresponding to the length L of feeder 30 targeted for removal according to the feeder information acquired in S105 (S205). In S205, loader control device 59, in accordance with the length L of feeder 30 targeted for removal, the standby position is set farthest toward the component mounting machine 20 side in the front-rear direction (Y-direction) within loader 50 while accommodating feeder 30 held by clamp portion 54. Next, loader control device 59 moves clamp portion 54 in front of slot 42 (opposing position) to which feeder 30 targeted for removal is installed (S210) and then moves clamp portion 54 in the Y-direction to clamp feeder 30 targeted for removal (S215). Subsequently, loader control device 59 pulls out clamped feeder 30 and moves clamp portion 54 to the standby position (S220), after which the process proceeds to S225.

Figure 10:
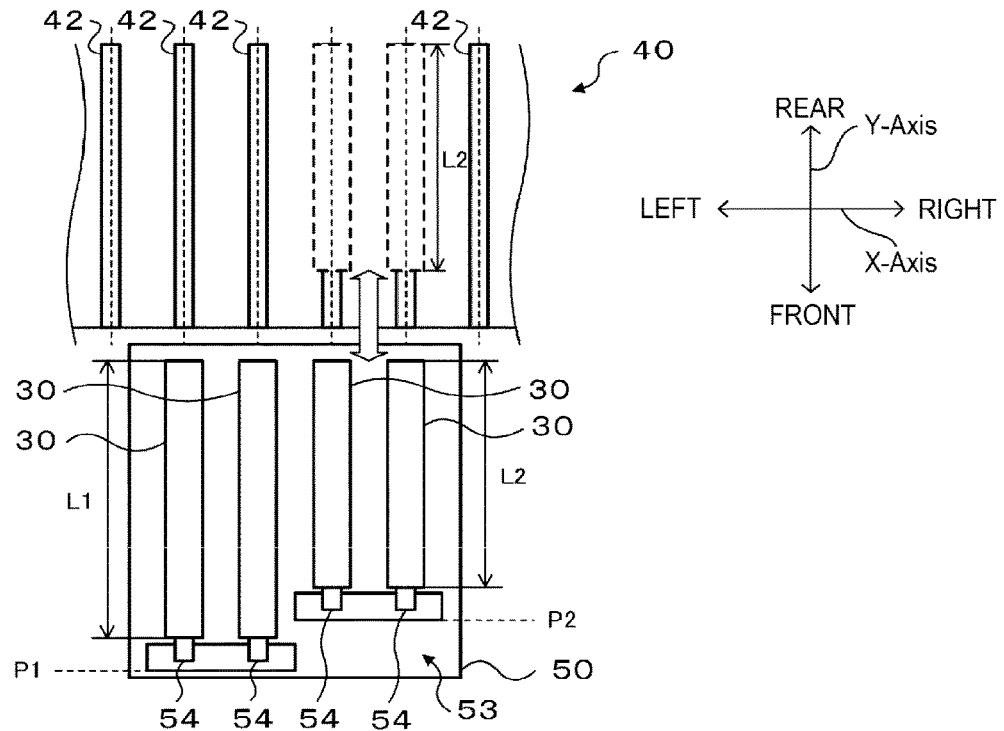
FIG. 10 A diagram showing the standby positions of clamp portions 54 holding feeders 30.
Figure 11:
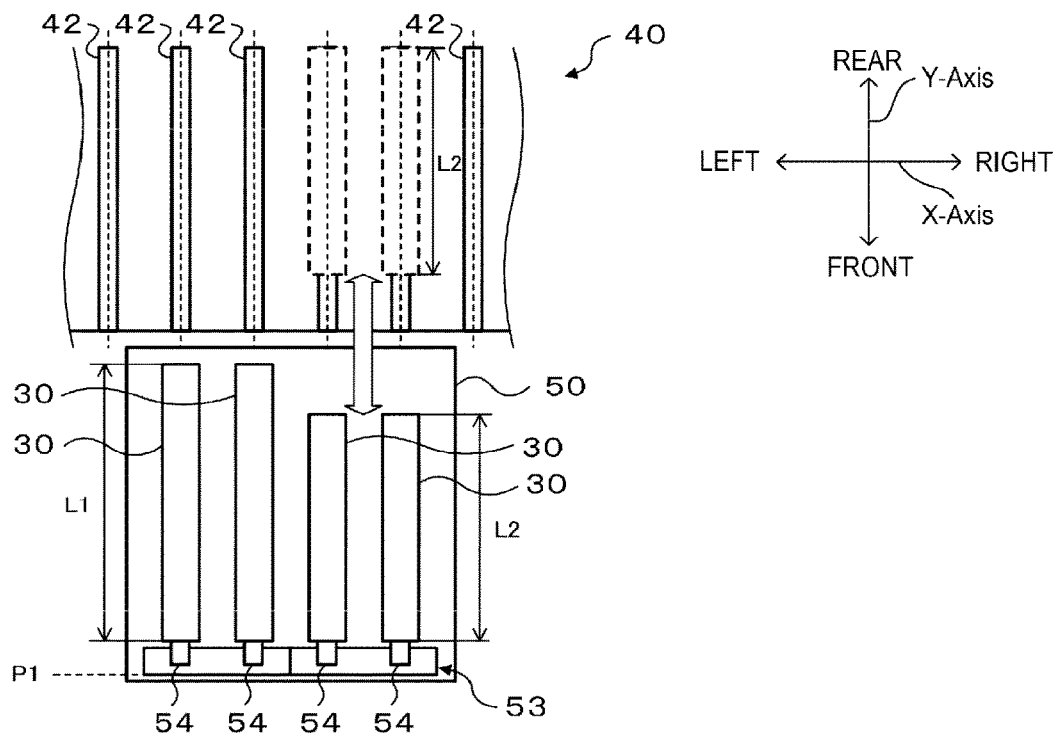
FIG. 11 A diagram showing the standby position of clamp portions 54 holding feeders 30.

FIGS. 10 and 11 are diagrams showing the standby position of clamp portion 54 holding feeder 30, where FIG. 10 shows the present embodiment and FIG. 11 shows a comparative example. In the present embodiment, the standby position is set in S205 in accordance with the length L of feeder 30 and feeder 30 is pulled out to the standby position and held in S220. Therefore, as shown in FIG. 10, when feeder 30 of relatively long length L1 is held, feeder 30 is placed in standby at the front side standby position P1, whereas when feeder 30 of relatively short length L2 is held, feeder 30 is placed in standby at standby position P2 further toward the component mounting machine 20 side than standby position P1 (rearward). On the other hand, in the comparative example, as shown in FIG. 11, waiting position P1 is set to a fixed position corresponding to length L1. Therefore, the moving amount of feeder 30 when feeder 30 having length L2 is attached/detached is smaller in the present embodiment than in the comparative example. Therefore, in the present embodiment, since the amount of movement of clamp portion 54 can be suppressed as compared with the comparative example, the time required for detaching feeder 30 is reduced. In the present embodiment, when detached feeder 30 is attached to another feeder base 40, the time required for the attachment can also be reduced.

Next, loader control device 59 determines whether an attachment of feeder 30 to slot 42 is included in the present automatic exchange instructions (S225), and when it is determined that an attachment is not included, the feeder attachment/detachment process ends. When it is determined that an attachment of feeder 30 is included, loader control device 59 moves clamp portion 54 in front of slot 42 currently targeted for attachment (opposing position) (S230). Subsequently, loader control device 59 moves clamp portion 54 in the Y-direction to insert feeder 30 into slot 42 (S235) and releases the clamping by clamp portion 54 to attach feeder 30 to slot 42 (S240). Loader control device 59 then retracts clamp portion 54 to the standby position of the component mounting machine 20 side (rear) (S245) and terminates the feeder attachment/detachment process.

Figure 12:
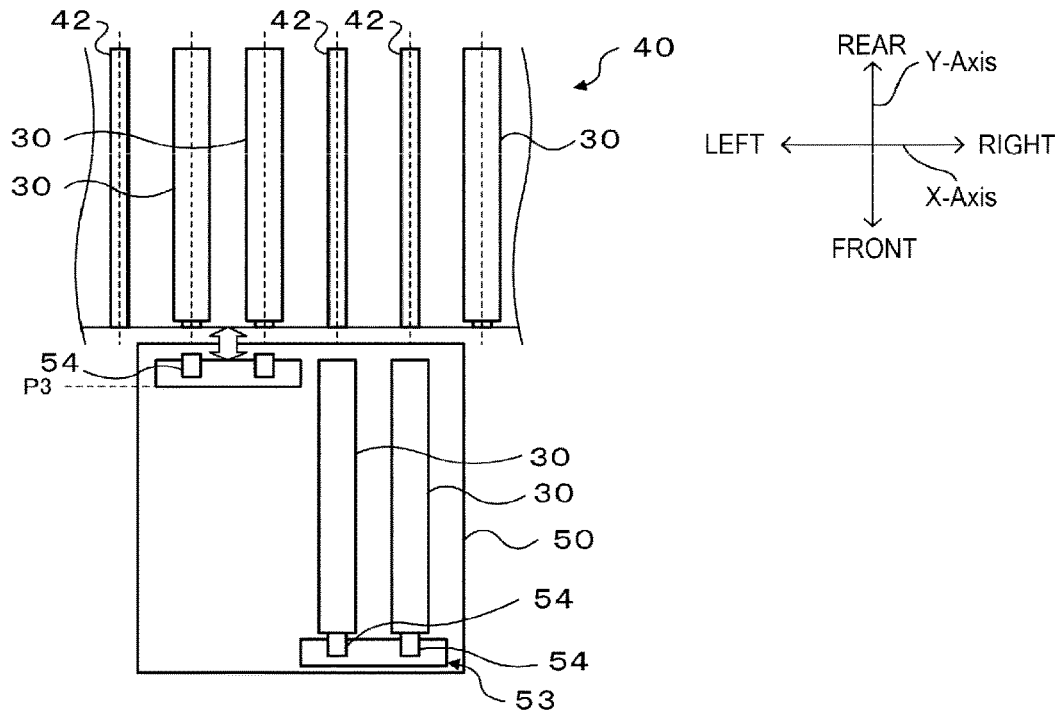
FIG. 12 A diagram showing the standby position of clamp portions 54 not holding feeders 30.
Figure 13:
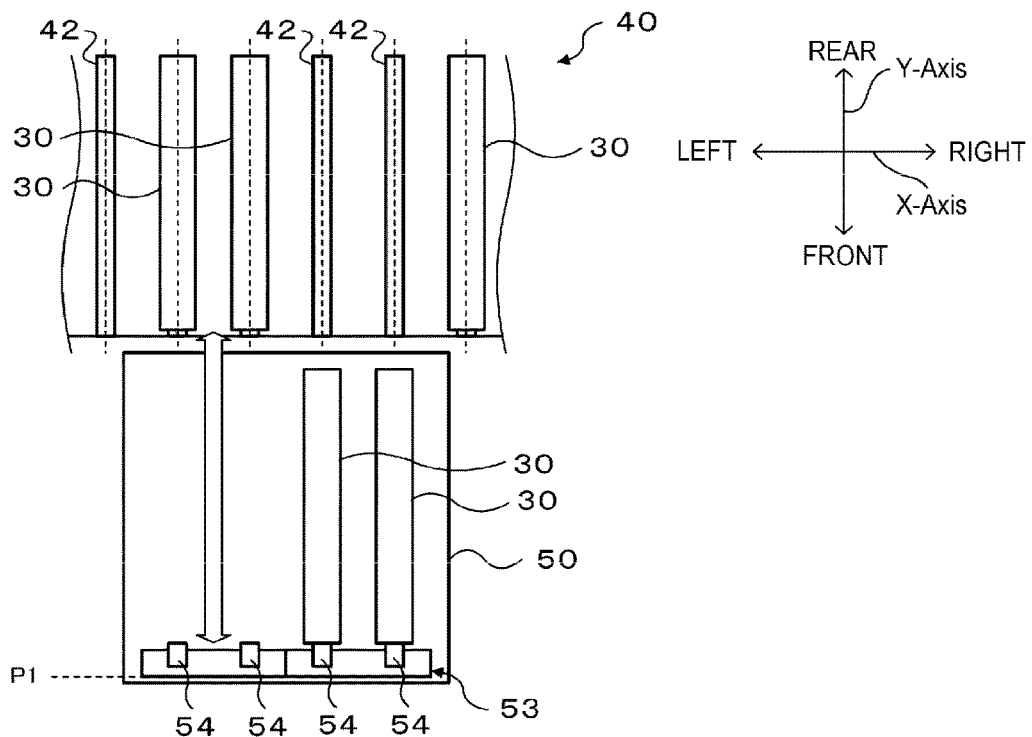
FIG. 13 A diagram showing the standby position of clamp portions 54 not holding feeders 30.

FIGS. 12 and 13 are diagrams showing the standby position of clamp portion 54 not holding feeder 30, where FIG. 12 shows the present embodiment and FIG. 13 shows a comparative example. In the present embodiment, as shown in FIG. 12, within the range in which clamp portion 54 not holding feeder 30 can occupy loader 50, clamp portion 54 is placed at standby position P3 farthest toward the component mounting machine 20 side (rearward). On the other hand, in the comparative example, as shown in FIG. 13, clamp portion 54 is placed in the same standby position P1 as when feeder 30 is held, thereby putting the standby position at the front position remotest from the component mounting machine 20 side. Therefore, in the embodiment, since the amount of movement required for clamp portion 54 to return to loader 50 after attaching feeder 30 to slot 42 (see arrow in the figure) is smaller than in the comparative example, the movement amount of clamp portion 54 is suppressed and the movement time is reduced when returning clamp portion 54 to loader 50 after attaching feeder 30. Further, in the embodiment, the next time clamp portion 54 not holding feeder 30 clamps feeder 30, the movement amount is reduced thereby shortening the movement time. Therefore, in the present embodiment, automatic exchange of feeder 30 is performed efficiently by suppressing the time required for attaching and detaching feeder 30.

Here, the correspondence relationship between constituent elements of the present embodiment and constituent elements of the present disclosure will be specified. Feeder 30 of the present embodiment corresponds to the component supply unit, component mounting machine 20 corresponds to the component mounting machine, loader 50 corresponds to the unit exchanging device, clamp portion 54 of feeder transfer mechanism 53 corresponds to the gripping portion, Y-axis slider 55 and Y-axis motor 55a of feeder transfer mechanism 53 corresponds to the moving section, and loader control device 59 that executes S140 of the feeder automatic exchange process of FIG. 8 (feeder attachment/detachment process in FIG. 9) corresponds to the control section.

Component mounting system 10 described above can make the standby position of clamp portion 54 suitable for attaching/detaching feeder 30 since the standby position of clamp portion 54 in loader 50 is changed in accordance with the clamping state of feeder 30 in clamp portion 54. As a result, since the movement amount of clamp portion 54 can be suppressed in the Y-direction, the time required for attaching and detaching feeder 30 can be suppressed, thereby making it possible to perform automatic exchange of feeder 30 efficiently.

Further, in state where clamp portion 54 is not clamping feeder 30, loader control device 59 makes a position closer to component mounting machine 20 in loader 50 the standby position of clamp portion 54. Therefore, by suppressing the movement amount of clamp portion 54 when returning clamp portion 54 into loader 50 after attaching feeder 30 in slot 42 and by suppressing the movement amount of clamp portion 54 when moving clamp portion 54 to clamp feeder 30 to detach feeder 30 from slot 42, it is possible to reduce the movement time. Further, in a state where clamp portion 54 is clamping feeder 30, while accommodating feeder 30 in loader 50, loader control device 59 makes a position closer to component mounting machine 20 the standby position based on the length L of feeder 30. As a result, it is possible to suppress the movement amount of clamp portion 54 and thereby reduce the movement time when performing the attachment/detachment of feeder 30.

It is needless to say that the present disclosure is not limited to the above-described embodiments and may be implemented in various modes as long as they belong to the technical scope of the present disclosure.

Figure 14:
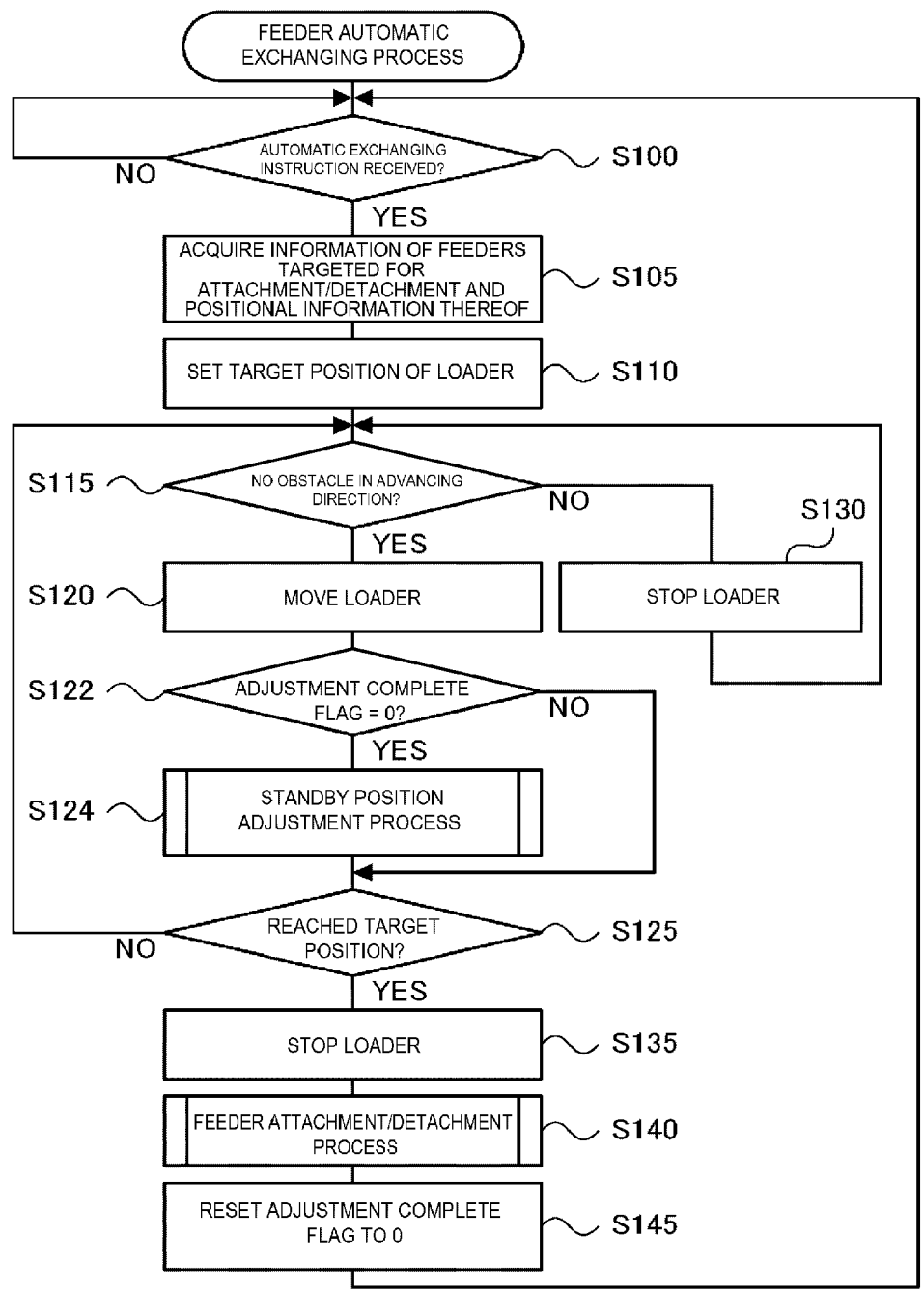
FIG. 14 A flowchart showing the feeder automatic exchange process of a modified example.
Figure 15:
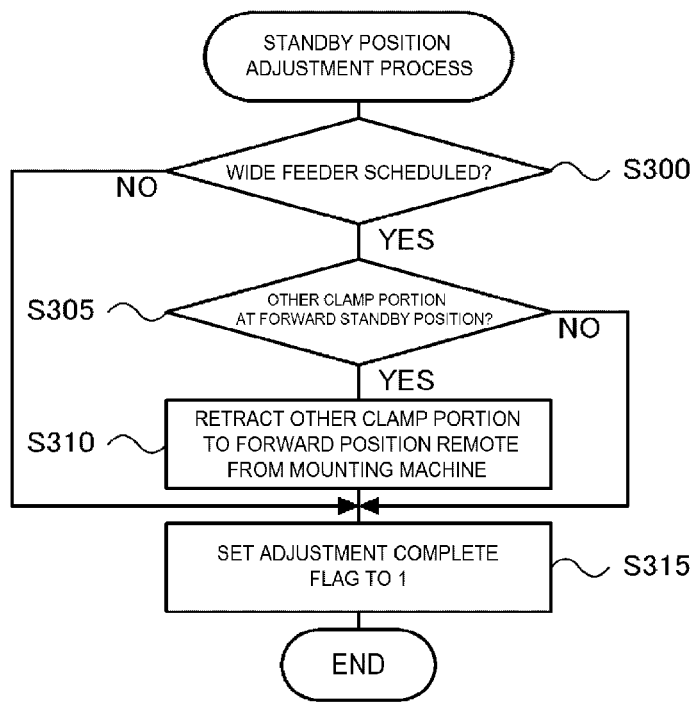
FIG. 15 A flowchart showing an example of a standby position adjustment process.

For example, although the standby position of clamp portion 54 is defined in accordance with the clamping state of feeder 30 in clamp portion 54 in the embodiment described above, the disclosure is not limited to this and the standby position may be defined in accordance with the clamping state scheduled in clamp portion 54. For example, in accordance with the clamp schedule of clamp portion 54 which moves by one of Y-axis sliders 55, the standby position of clamp portion 54 may be changed to the standby position of clamp portion 54 moved by another Y-axis slider 55. FIG. 14 is a flowchart showing the feeder automatic exchange process of a modified example. In the modified example, the same step numbers are assigned to the same processes as those in the flowchart of FIG. 8, and a detailed description thereof is omitted. In the modified example, loader control device 59 determines whether an adjustment complete flag has a value of 0 while loader 50 is moving (S122) and proceeds to S125 if the adjustment complete flag does not have a value of 0 but a value of 1. On the other hand, when it is determined that the adjustment complete flag has a value of 0, loader control device 59 executes the standby position adjustment process (S124) shown in FIG. 15 and proceeds to S125.

In the standby position adjustment process of S124 (FIG. 15), loader control device 59 determines whether the next attachment/detachment target in any of clamping portions 54 is a wide feeder 30 (S300), and when it is determined that there are no wide feeders 30, the process proceeds to S315. As described above, a wide feeder 30 is attached so as to occupy not only one slot 42 but multiple slots 42. Therefore, when a wide feeder 30 is clamped by any one of clamp portions 54, feeder 30 may interfere with clamp portion 54 moved by another Y-axis slider 55 adjacent to Y-axis slider 55 moving clamp portion 54. When the next attachment/detachment target in any of clamp portions 54 is determined to be a wide feeder 30, loader control device 59 determines whether clamp portion 54 of the other Y-axis slider 55 (hereinafter, the other clamp portion 54) is standing by at the forward position remotest from the component mounting machine 20 side (S305). When the other clamp portion 54 is determined not to be standing by at the forward position, loader control device 59 retracts the other clamp portion 54 to the forward position (S310) and the process proceeds to S315. Further, when it is determined that the other clamp portion 54 is standing by at the forward position, loader control device 59 skips S310 and proceeds to S315. Loader control device 59 then sets the adjustment complete flag to 1 (S315) and ends the standby position adjustment process. When the feeder attachment/detachment exchange process is executed in S140 in the feeder automatic exchange process of FIG. 14, loader control device 59 resets the adjustment complete flag to 0 (S145) and returns to S100.

Figure 16A:
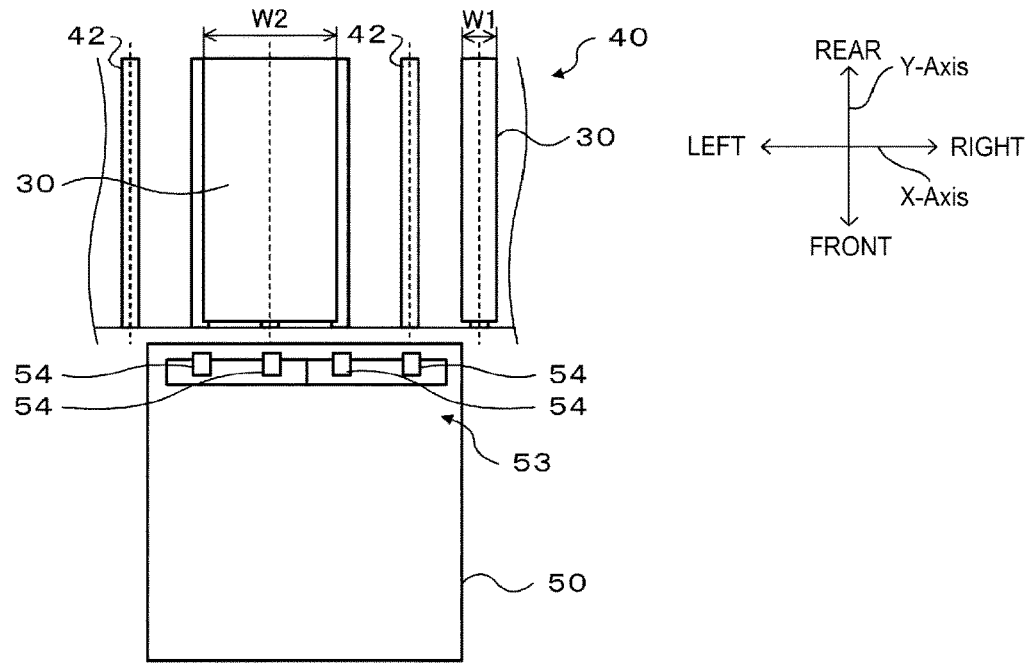
FIG. 16 A diagram showing feeder transfer mechanism 53 of a comparative example in operation.
Figure 16B:
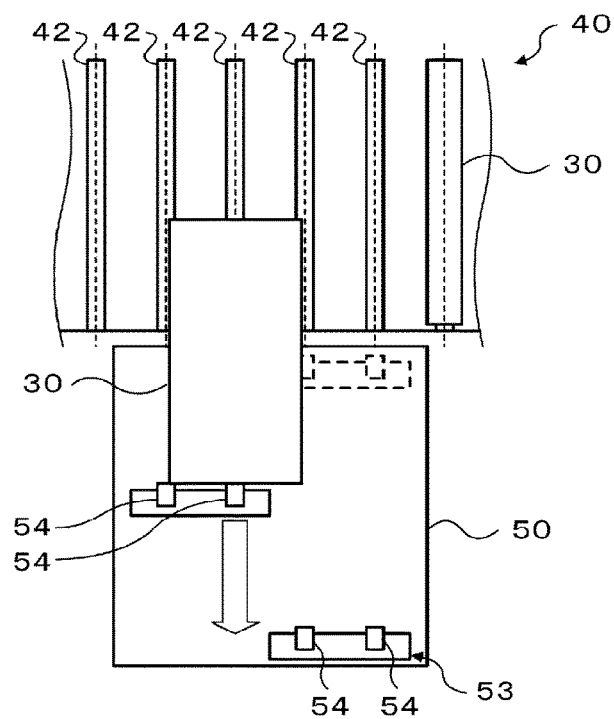
Figure 17A:
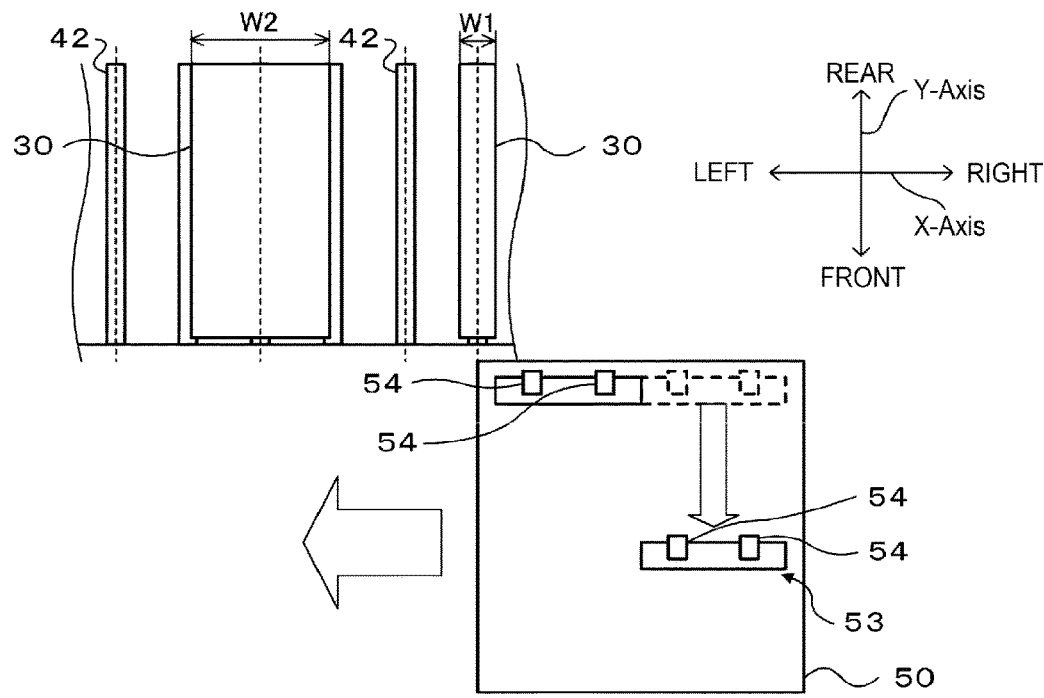
FIG. 17 A diagram showing feeder transfer mechanism 53 of a modified example in operation.
Figure 17B:
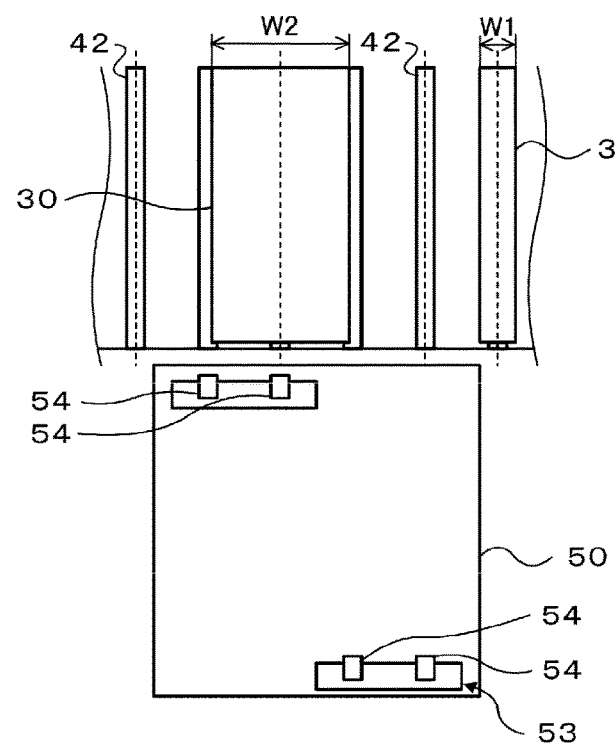

Here, FIG. 16 is a diagram showing feeder transfer mechanism 53 of the comparative example in operation, and FIG. 17 is a diagram showing feeder transfer mechanism 53 of the modified example in operation. Here, as shown in FIG. 16A and FIG. 17A, the detaching from feeder base 40 of feeder 30 of width W2 wider than feeder 30 of normal width W1 will be described. As in FIG. 16A, when both clamp portions 54 are in the standby position of the component mounting machine 20 side (rear), detaching feeder 30 of width W2 with the left clamp portion 54 will interfere with the other clamp portion 54 (here the right clamp portion 54) (see dotted lines in FIG. 16B). Therefore, when loader 50 reaches the target position, it is necessary to detach feeder 30 of width W2 after moving the other clamp portion 54 to the forward position remotest from the component mounting machine 20 side. Therefore, in the comparative example, after loader 50 reaches the target position, the starting of detachment of feeder 30 is delayed until the other clamp portion 54 is moved to the forward position. In contrast, in the modified example, since the standby position adjustment process is executed while loader 50 is being moved, the other clamp portion 54 starts moving to the forward position while loader 50 is moving (FIG. 17A). Therefore, since the other clamp portion 54 has already finished moving (FIG. 17B) by the time loader 50 is moved to the target position, there is no waiting for the movement of the other clamp portion 54, thereby enabling immediate detachment of feeder 30. Therefore, in the modified example, without any waiting time after loader 50 reaches the target position, it is possible to perform the automatic exchange process of feeder 30 quickly.

Thus, in the modified example, since the standby position is changed in accordance with the clamping state of feeder 30 scheduled for clamp portion 54, it is possible to change the standby position of clamp portion 54 in advance. Further, in the modified example, since the standby position of the other clamp portion 54 is changed when the next attachment/detachment target in any of clamp portions 54 is a wide feeder 30, it is possible to adequately prevent interference caused by the wide feeder 30. Furthermore, in the modified example, since the position adjustment of the other clamp portion 54 is performed while loader 50 is being moved, it is possible to minimize waiting time for changing the standby position of the other clamp portion 54. As a result, the automatic exchange of feeder 30 is performed promptly, further improving the exchange efficiency.

In the above-described embodiment, loader control device 59 receives feeder information of the attachment/detachment target via communication with management device 80, but the present disclosure is not limited thereto. For example, loader control device 59 may receive feeder information of the attachment/detachment target via communication with mounting control device 28 of each component mounting device 20. In such cases, the feeder management information of each component mounting machine 20 is not limited to information managed by management device 80 but may be information managed by mounting control device 28 of each component mounting machine 20.

In the above-described embodiment, loader control device 59 sets the standby position of clamp portion 54, but the present disclosure is not limited thereto, and management device 80 and mounting control device 28 of component mounting machine 20 may set the standby position, include the standby position in the feeder information, and transmit the information to loader control device 59. Alternatively, an appropriate standby position corresponding to the size of feeder 30 may be included in the feeder information in advance.

In the embodiment described above, two Y-axis sliders 55 are provided, but the present disclosure is not limited thereto, and three or more Y-axis sliders 55 may be provided. Alternatively, each Y-axis slider 55 may be made to move one clamp portion 54.

In the embodiment described above, Y-axis slider 55 converts the rotational power of Y-axis motor 55a by a conversion mechanism such as a belt mechanism and slides, but the present disclosure is not limited to this, and Y-axis slider 55 may slide by way of an air cylinder or the like, for example. In such a case, a multi-stage cylinder or the like may be utilized in which multiple air cylinders are connected in series and configured so that clamp portions 54 can be placed on standby at multiple positions. Further, without supplying air, clamp portion 54 is at standby position P1 which is a forward position remotest from the component mounting machine 20 side, and is configured so that clamp portion 54 is placed at standby position P2 and standby position P3 described above by supplying of air. Further, in the case, for example, where clamp portion 54 is scheduled not to clamp feeder 30 for a predetermined period of time or longer, loader control device 50 may place clamp portion 54 on standby at standby position P1 in order to stop driving of an air supply device such as an air compressor.

In the unit exchanging device of the present disclosure, the control section may change the standby position in the unit exchanging device so that the standby position is closer to the component mounting machine when the gripping portion is not gripping a component supply unit. In this way, the gripping portion not gripping a component supply unit reduces the movement amount when detaching a component supply unit from the component mounting machine, thereby minimizing the movement time.

In the unit exchanging device of the present disclosure, with a length acquiring section for acquiring the length of a component supply unit in the predetermined direction, the control section may be made to change the standby position so that the standby position is closer to the component mounting machine while the gripping portion grips a component supply unit targeted for gripping and the component supply unit is accommodated in the unit exchanging device based on the length of the component supply unit. In this way, the gripping portion gripping a component supply unit reduces the movement amount when installing a component supply unit into the component mounting machine, thereby minimizing the movement time.

In the unit exchanging device of the present disclosure, the control section may change the standby position in accordance with the gripping state of the component supply unit scheduled in the gripping portion. In this way, since the standby position of the gripping portion can be changed in advance to a position corresponding to the scheduled gripping state, automatic exchange of the component supply unit can be performed more efficiently.

The unit exchanging device of the present disclosure may include multiple gripping portions and multiple moving sections, being arranged side by side in an orthogonal direction orthogonal to the predetermined direction, each of which moving one of the multiple gripping portions, and the control section may change the standby position of a gripping portion so as to avoid interference when the interference is scheduled between a first gripping portion and a component supply unit, being scheduled to be gripped by a second gripping portion moved by a moving section, one of multiple moving sections, based on the width in the orthogonal direction of the component supply unit, the first gripping portion being moved by the other one of multiple moving sections, which is different from the moving section. In this way, since the standby position of the gripping portion can be changed in advance to a position where interference by the width of the component supply unit does not occur, automatic exchange of the component supply unit can be performed more efficiently.

In the unit exchanging device of the present disclosure, the control section may be made to control the moving section so as to change the standby position while the unit exchanging device is moving toward a position along the arrangement direction of the multiple component mounting machines where the component supply unit can be attached/detached. In this way, since the standby position of the gripping portion can be changed while the unit exchanging device is being moved, the waiting time for changing the standby position of the gripping portion can be minimized. As a result, it is possible to perform the automatic exchange of the component supply unit more efficiently.

INDUSTRIAL APPLICABILITY

The present disclosure can be applied in the manufacturing industry involving component mounting systems and the like.

REFERENCE SIGNS LIST

10 Component mounting system, 12 Printing machine, 14 Printing inspection machine, 18 X-axis rail, 20 component mounting machine, 20A supply area, 20B stock area, 21 Board conveyance device, 22 Head, 23 Head moving mechanism, 28 Mounting control device, 30 Feeder, 32 Tape reel, 33 Tape feeding mechanism, 34 Positioning pin, 35 Connector, 37 Rail member, 39 Feeder control device, 40 Feeder base, 42 Slot, 44 Positioning hole, 45 Connector, 50 Loader, 50A Upper transfer area, 50B Lower transfer area, 51 Loader moving mechanism, 52a X-axis motor, 52b Guide roller, 53 Feeder transfer mechanism, 54 Clamp portion, 55 Y-axis slider, 55a Y-axis motor, 55b Y-axis guide rail, 56 slide base, 56a Z-axis motor, 56b Z-axis guide rail, 57a X-axis position sensor, 57b Y-axis position sensor, 58a,58b monitoring sensor, 59 Loader control device, 60 Feeder storage, 62 Board conveyance device, 80 Management device, 80*a* CPU, 80*b* ROM, 80*c* HDD, 80*d* RAM, 82 Display, 84 Input device, S board.

The invention claimed is:

1. A unit exchanging device configured to automatically exchange a component supply unit between multiple component mounting machines in which multiple component supply units for supplying components are detachably installed, the unit exchanging device comprising:
   a clamp configured to grip the component supply unit;
   a slider configured to move the clamp along a predetermined direction between a working position at which the clamp attaches or detaches the component supply unit to and from the component mounting machine and a standby position within the unit exchanging device; and
   a controller including a processor configured to
      control the clamp to grip and release the component supply unit by the clamp and move the clamp by the slider for at least one of attaching the component supply unit to the component mounting machine and detaching the component supply unit from the component mounting machine, and
      control the slider to change the standby position based on whether or not the clamp is gripping the component supply unit,
   wherein when the clamp is gripping the component supply unit, the controller is configured to change the standby position of the slider based on a maximum dimension of the component supply unit in the predetermined direction such that the slider is closer to a component mounting machine side as the maximum dimension of the component supply unit decreases, and
   wherein when the clamp is not gripping the component supply unit, the controller is configured to change the standby position of the slider to a position closest to the component mounting machine side.

2. The unit exchanging device of claim 1, wherein the controller is configured to change the standby position based on a scheduled gripping of the component supply unit by the clamp.

3. The unit exchanging device of claim 2, wherein the clamp includes a plurality of clamps,
   wherein the slider includes a plurality of sliders arranged side by side in an orthogonal direction orthogonal to the predetermined direction, each slider of the plurality of sliders configured to move one clamp of the plurality of clamps, and
   wherein the controller is configured to change the standby position of one slider of the plurality of sliders based on a width in the orthogonal direction of the component supply unit when a first clamp of the plurality of clamps is scheduled to grip one of the component supply units, the first clamp being moved by a slider of the plurality of sliders being different from the one slider of the plurality of sliders.

4. The unit exchanging device of claim 1, wherein the controller is configured to control the slider so as to change the standby position while the unit exchanging device is moving to a position along the arrangement direction of the multiple component mounting machines where component supply units can be attached or detached.

* * * * *